US012253286B2

(12) United States Patent
Catton et al.

(10) Patent No.: US 12,253,286 B2
(45) Date of Patent: Mar. 18, 2025

(54) COOLING APPARATUS

(71) Applicant: Nokia Technologies Oy, Espoo (FI)

(72) Inventors: Phil Catton, Cambridge (GB); Christopher Wright, London (GB); Wai Lau, London (GB)

(73) Assignee: Nokia Technologies Oy, Espoo (FI)

( * ) Notice: Subject to any disclaimer, the term of this patent is extended or adjusted under 35 U.S.C. 154(b) by 206 days.

(21) Appl. No.: 17/444,527

(22) Filed: Aug. 5, 2021

(65) Prior Publication Data

US 2022/0057118 A1    Feb. 24, 2022

(30) Foreign Application Priority Data

Aug. 19, 2020  (EP) .................................. 20191646

(51) Int. Cl.
*F25B 21/00*        (2006.01)
(52) U.S. Cl.
CPC ...... *F25B 21/00* (2013.01); *F25B 2321/0023* (2013.01)
(58) Field of Classification Search
CPC .................. F25B 21/00; F25B 2321/0023
See application file for complete search history.

(56) References Cited

U.S. PATENT DOCUMENTS

| 6,624,539 B1 | 9/2003 | Hansen et al. |
| 9,516,792 B2 | 12/2016 | Krishnan et al. |
| 2017/0303594 A1 | 10/2017 | Cameron et al. |

FOREIGN PATENT DOCUMENTS

| CN | 101005717 A | 7/2007 |
| CN | 103115455 A | 5/2013 |
| CN | 104013426 A | 9/2014 |
| JP | H0518040 U | 3/1993 |
| KR | 101399515 B1 | 6/2014 |
| WO | 2009/051001 A1 | 4/2009 |

OTHER PUBLICATIONS

Ekreem et al., "An Overview of Magnetostriction, Its Use and Methods to Measure These Properties", Journal of Materials Processing Technology, vol. 191, 2007, pp. 96-101.
"SwRI Improves Structural Health Monitoring with Magnetostrictive Transducer", Southwest Research Institute, Retrieved on Jul. 14, 2021, Webpage available at : https://www.swri.org/press-release/swri-magnetostrictive-transducer-nondestructive-evaluation-nde.
Nathanson et al., "Radar Design Principles: Signal Processing and the Environment", Second Edition, McGraw-Hill, Inc., 1991, 724 pages.

(Continued)

*Primary Examiner* — Gordon A Jones
(74) *Attorney, Agent, or Firm* — McCarter & English, LLP

(57) ABSTRACT

According to various, but not necessarily all, examples of the disclosure there is provided an apparatus comprising: one or more portions of material configured to vibrate at one or more ultrasonic frequencies when the material is positioned within a varying magnetic field; and wherein the one or more portions of material configured to vibrate at one or more ultrasonic frequencies are positioned so that, when a varying magnetic field is applied to the apparatus, the vibration caused by the varying magnetic field provides increased cooling within a cooling system.

14 Claims, 4 Drawing Sheets

(56) References Cited

OTHER PUBLICATIONS

Figure 1:
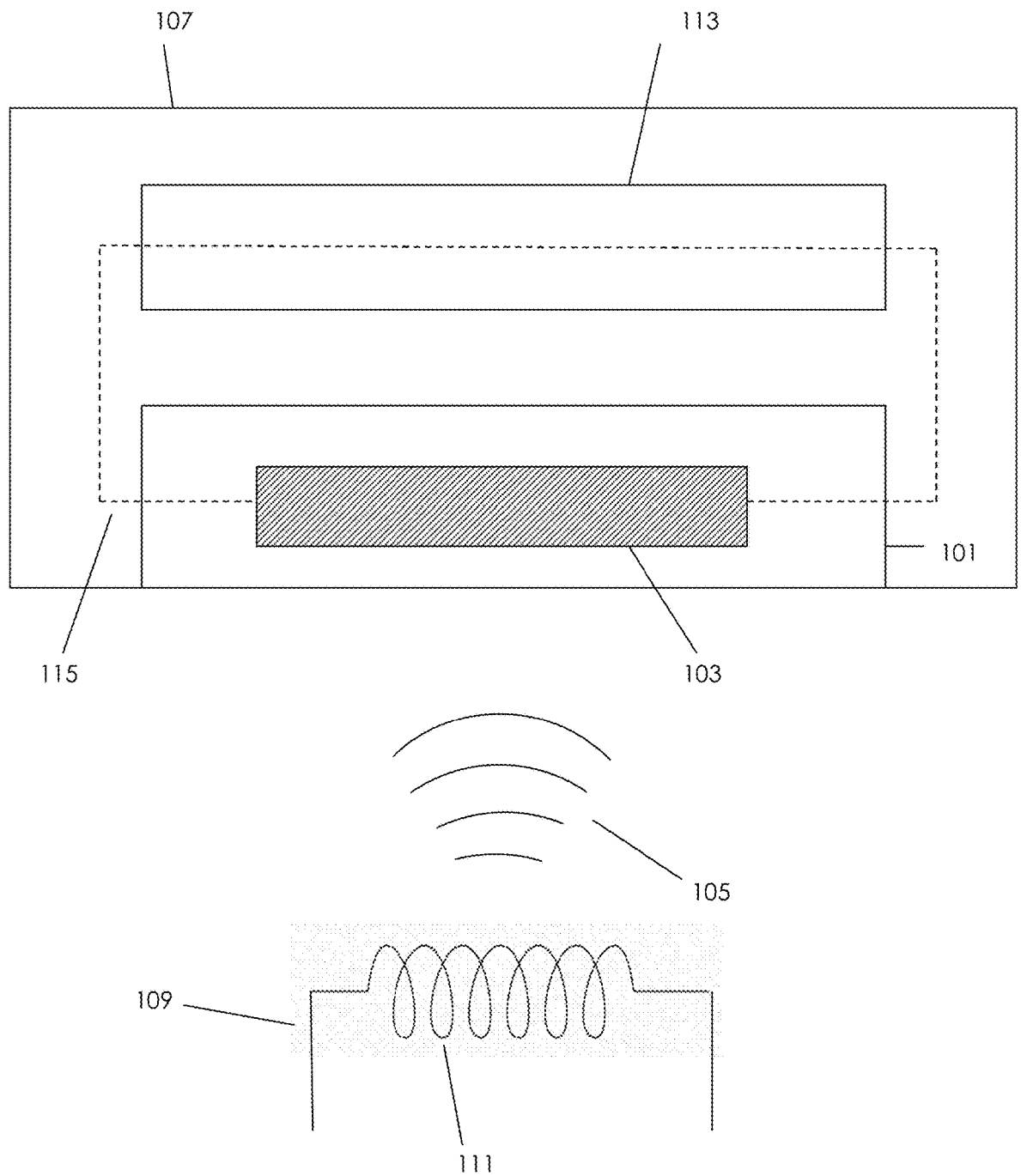

"Phased Array Design and Analysis", MathWorks United Kingdom, Retrieved on Jul. 14, 2021, Webpage available at : https://uk.mathworks.com/help/phased/phased-arrays.html.

"Different Types of Heat Pipes", Advanced Cooling Technologies, Retrieved on Jul. 14, 2021, Webpage available at : https://www.1-act.com/resources/heat-pipe-fundamentals/different-types-of-heat-pipes/.

"Air Purifiers, Humidifiers & Filters", Holmes, Retrieved on Jul. 14, 2021, Webpage available at : https://www.holmesproducts.com/blog/archive/2014/october/how-does-an-ultrasonic-humidifier-work%3F.html.

"Apple Reveals new Speaker System Design that is focused on Operating at Cooler Temperatures", Patently Apple, Retrieved on Jul. 14, 2021, Webpage available at : https://www.patentlyapple.com/patently-apple/2020/05/apple-reveals-new-speaker-system-design-that-is-focused-on-operating-at-cooler-temperatures.html.

"Acoustic Streaming", Wikipedia, Retrieved on Jul. 14, 2021, Webpage available at : https://en.wikipedia.org/wiki/Acoustic_streaming.

Nakajima et al., "Remotely Displaying Cooling Sensation via Ultrasound-driven Air Flow", IEEE Haptics Symposium (Haptics), Mar. 25-28, 2018, pp. 340-343.

"Download the Qi Specifications", Wireless Power Consortium, Retrieved on Jul. 14, 2021, Webpage available at : https://www.wirelesspowerconsortium.com/knowledge-base/specifications/download-the-qi-specifications.html.

"This $140 Wireless Charging Pad has 16 Coils and can Fast Charge Two Phones at Once", Android Police, Retrieved on Jul. 14, 2021, Webpage available at : https://www.androidpolice.com/2019/08/23/this-140-wireless-charging-pad-has-16-coils-and-can-fast-charge-two-phones-at-once/.

Kutnjak et al., "Electrocaloric Effect: Theory, Measurements, And Applications", Wiley Encyclopedia of Electrical and Electronics Engineering, J. Webster (ed.), 2015, pp. 1-19.

"Vivo Z6 5G's 'PC-Grade Liquid Cooling' Detailed, Multi-Turbo 3.0 Acceleration Teased", Gadgets 360, Retrieved on Jul. 14, 2021, Webpage available at : https://gadgets.ndtv.com/mobiles/news/vivo-z6-5g-teasers-pc-grade-liquid-cooling-multi-turbo-acceleration-details-gaming-mode-2185583.

Song et al., "Enhancement of Heat Transfer Performance Using Ultrasonic Evaporation", International Journal of Food Engineering, vol. 15, No. 5-6, Mar. 30, 2019, pp. 1-12.

"Inductive Wireless Charging is Now a Thermal Design Problem", Electronics Cooling, Retrieved on Jul. 14, 2021, Webpage available at : https://www.electronics-cooling.com/2017/01/inductive-wireless-charging-now-thermal-design-problem/.

Extended European Search Report received for corresponding European Patent Application No. 20191646.7, dated Jan. 21, 2021, 7 pages.

COOLING APPARATUS

TECHNOLOGICAL FIELD

Examples of the disclosure relate to a cooling apparatus. Some relate to a cooling apparatus for electronic devices.

BACKGROUND

Electronic devices can generate unwanted heat during use. It is therefore useful to provide apparatus for enabling cooling of such electronic devices.

BRIEF SUMMARY

According to various, but not necessarily all, examples of the disclosure there is provided an apparatus comprising: one or more portions of material configured to vibrate at one or more ultrasonic frequencies when the material is positioned within a varying magnetic field; and wherein the one or more portions of material configured to vibrate at one or more ultrasonic frequencies are positioned so that, when a varying magnetic field is applied to the apparatus, the vibration caused by the varying magnetic field provides increased cooling within a cooling system.

The apparatus may comprise means for providing a varying magnetic field having ultrasonic frequencies.

The means for providing a varying magnetic field may comprise one or more charging coils that can be configured to enable inductive charging of an electronic device.

The means for providing a varying magnetic field may comprise a plurality of charging coils that are configured so that a first subset of the charging coils can be used for wireless charging of an electronic device while a second subset of the charging coils can be used for providing the varying magnetic field.

The plurality of charging coils may be provided in the first subset and the second subset is dependent upon the position of the electronic device relative to the plurality of charging coils.

The apparatus may be configured so that the vibration of the one or more portions of material configured to vibrate at one or more ultrasonic frequencies causes an increase flow of working fluid within a cooling system.

The one or more portions of material configured to vibrate at one or more ultrasonic frequencies may be shaped so as to direct flow of the working fluid in a given direction.

The apparatus may be configured so that the vibration of the one or more portions of material configured to vibrate at one or more ultrasonic frequencies causes an increase of evaporation of a working fluid within a cooling system.

The apparatus may comprise a plurality of portions of material configured to vibrate at one or more ultrasonic frequencies and the plurality of portions of material configured to vibrate at one or more ultrasonic frequencies are provided in a periodic array to control the flow of working fluid through acoustic interference patterns generated by vibration of at least some of the plurality of portions of material configured to vibrate at one or more ultrasonic frequencies.

The apparatus may comprise a plurality of different arrays of portions of material configured to vibrate at one or more ultrasonic frequencies where different arrays are configured to vibrate at different frequencies.

The apparatus may comprise means for controlling the frequency of the varying magnetic field so as to control the level of cooling within the cooling system.

The apparatus may be configured to control the location at which cooling is provided by at least one of; the arrangement of the portions of material configured to vibrate, the frequency of the magnetic field.

The portions of material configured to vibrate may comprise at least one of: magnetostrictive material, magnetocaloric material.

According to various, but not necessarily all, examples of the disclosure there is provided a method comprising: selecting one or more portions of material configured to vibrate at one or more ultrasonic frequencies when the material is positioned within a varying magnetic field, the selection based on heat transfer requirements of a cooling system; controlling one or more sources of a varying magnetic field to provide a varying magnetic field at a frequency corresponding to the selected one or more portions of material configured to vibrate at one or more ultrasonic frequencies.

According to various, but not necessarily all, examples of the disclosure there is provided a computer program comprising computer program instructions that, when executed by processing circuitry, cause: selecting one or more portions of material configured to vibrate at one or more ultrasonic frequencies when the material is positioned within a varying magnetic field, the selection based on heat transfer requirements of a cooling system; controlling one or more sources of a varying magnetic field to provide a varying magnetic field at a frequency corresponding to the selected one or more portions of material configured to vibrate at one or more ultrasonic frequencies.

BRIEF DESCRIPTION

Figure 2:
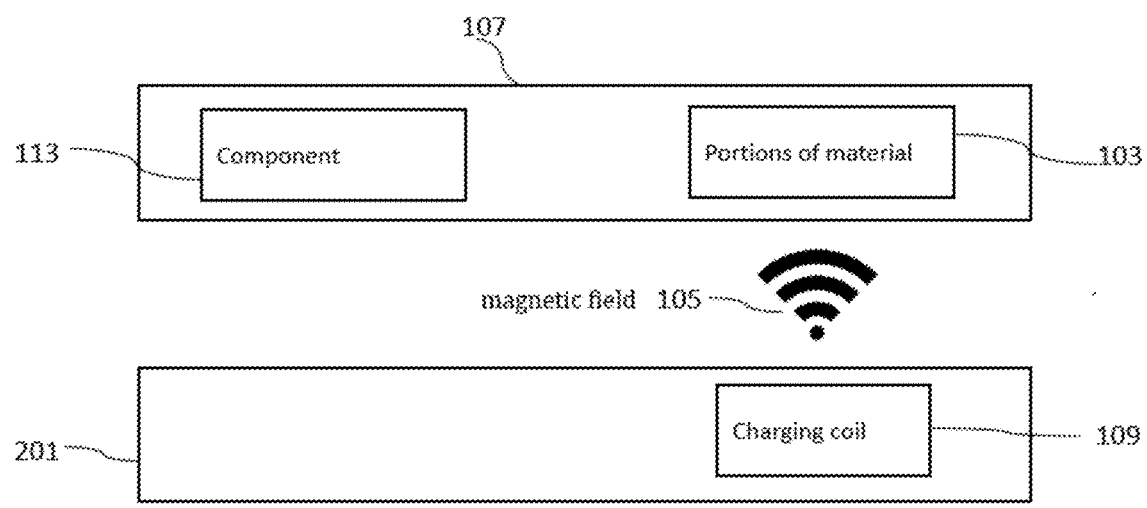
Figure 3:
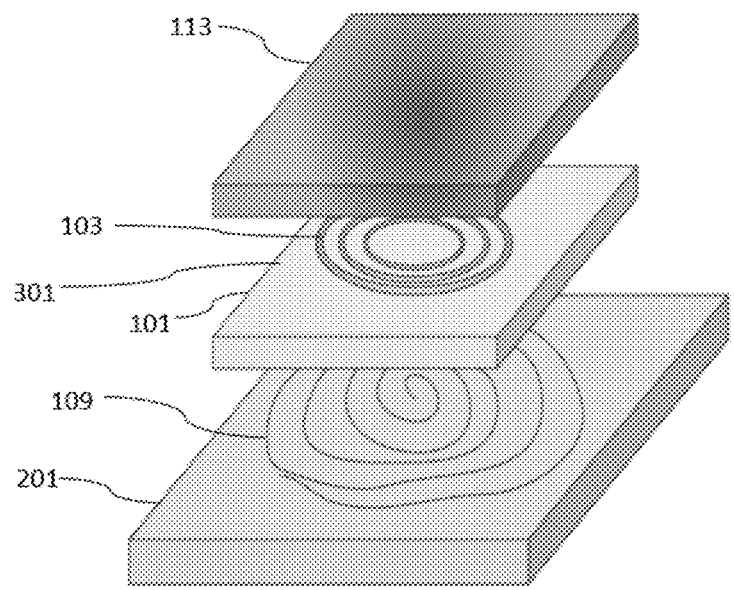
Figure 4:
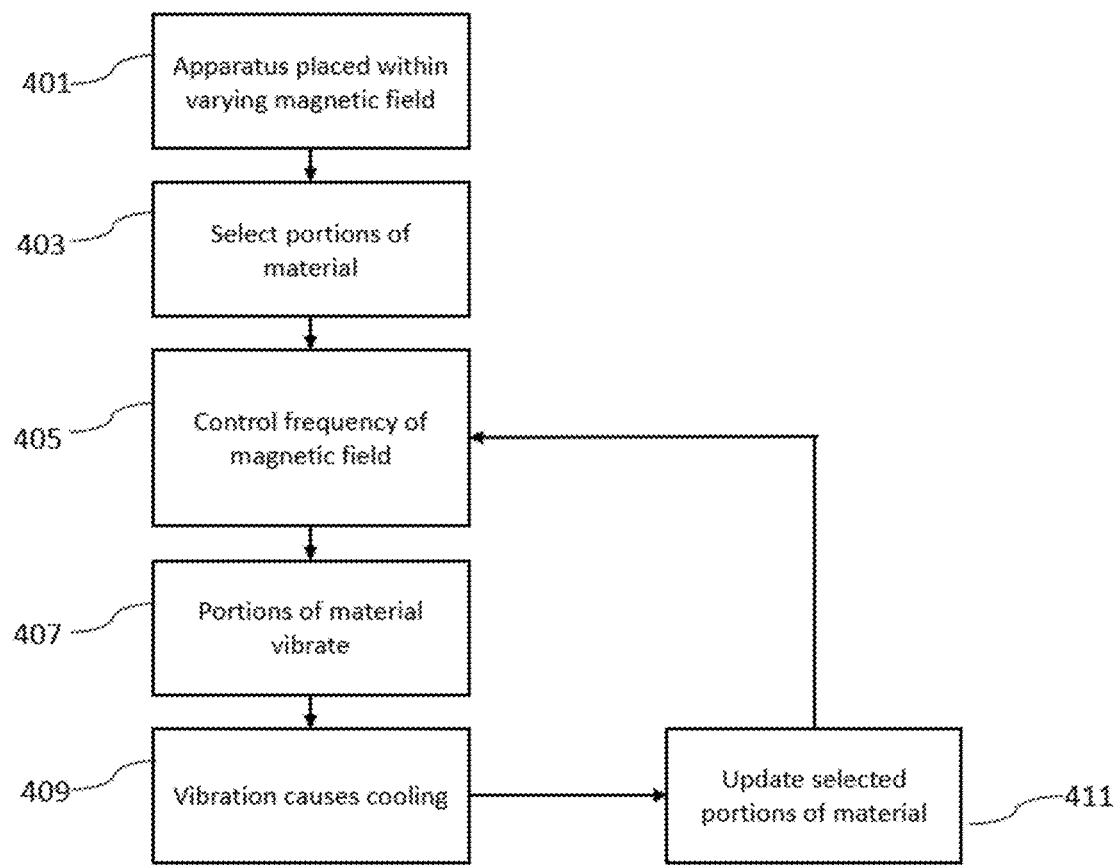
Figure 5:
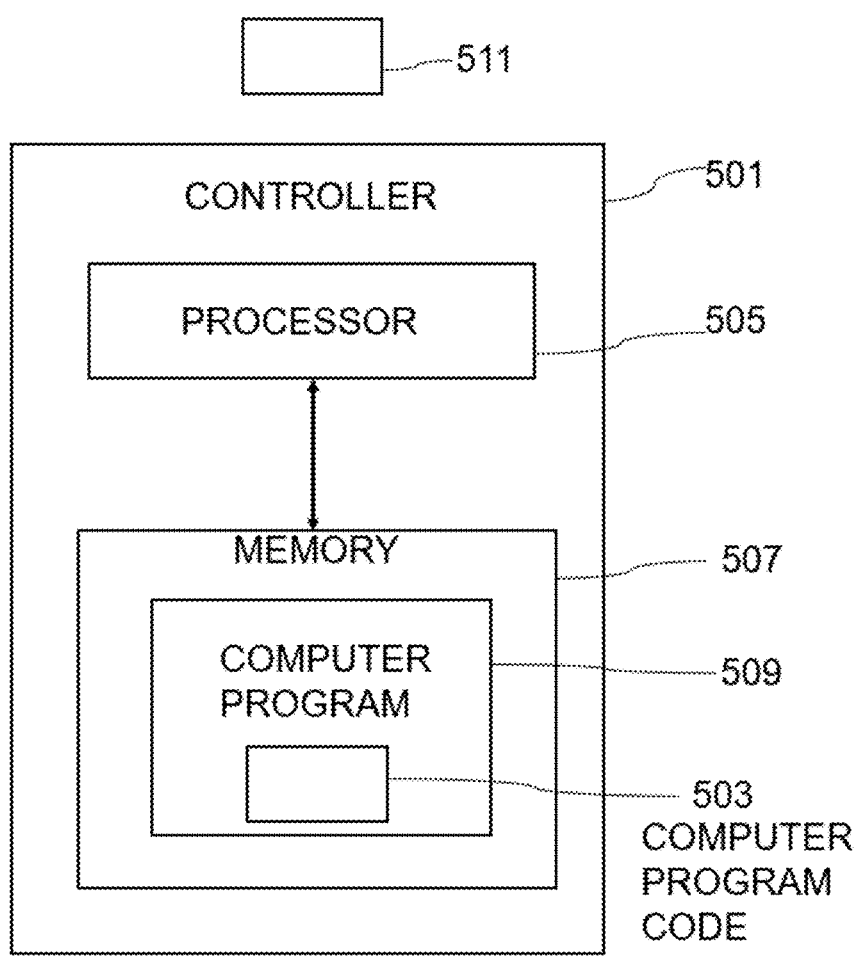

Some examples will now be described with reference to the accompanying drawings in which:

FIG. 1 shows an example apparatus;
FIG. 2 shows another example apparatus;
FIG. 3 shows another example apparatus;
FIG. 4 shows an example method; and
FIG. 5 shows an example controller.

DETAILED DESCRIPTION

Examples of the disclosure relate to an apparatus that enables cooling of electronic devices through the use of magnetostrictive materials or other materials that vibrate when positioned in a varying magnetic field. In some examples one or more controllers can be provided to enable control of the apparatus 101.

FIG. 1 schematically shows an apparatus 101 for enabling cooling according to examples of the disclosure. The cooling apparatus 101 comprises one or more portions of material 103 configured to vibrate at one or more ultrasonic frequencies when the material is positioned within a varying magnetic field 105.

In the example shown in FIG. 1 the apparatus 101 is provided within an electronic device 107. The apparatus 101 could be provided as a cooling module or component within the electronic device 107. For example the apparatus 101 could be provided as a vapour chamber or heat pipe within the electronic device 107. In some examples the apparatus 101 could be provided as part of a component of the electronic device 107.

The electronic device 107 could be a mobile phone, a laptop or any other suitable type of electronic device 107. The electronic device 107 comprises one or more components 113 that require cooling. The components 113 can comprise processing units, power sources, display units, transceiver modules or any other components that generate unwanted heat during use.

A cooling system 115 is provided to enable cooling of the electronic device 107. The cooling system 115 can comprise any means that enables heat to be transferred away from the components 113. In some examples the cooling system 115 can comprise a two-phase cooling system such as a vapour chamber or heat pipe. In other examples the cooling system could comprise a single-phase cooling system such as an air-cooled system.

In the example of FIG. 1 the cooling system 115 is shown as being part of the electronic device 107. It is to be appreciated that in other examples the cooling system 115 could be distributed between different devices. For example, an air-cooled system could comprise an auxiliary or peripheral device that directs air flow to the electronic device as needed.

The apparatus 101 comprises one or more portions of material 103 configured to vibrate at one or more ultrasonic frequencies when the material is positioned within a varying magnetic field 105. The one or more portions of material 103 can be configured to respond to one or more predetermined frequencies of magnetic fields 105. For example, the size and shape of the portions of material 103 can be selected so that a resonant mode of the portions of material corresponds to a frequency of the magnetic fields that is to be used. In some examples a plurality of portions of material 103 can be provided where the different portions of material 103 have different sizes and/or shapes so that they have different resonant modes corresponding to different frequencies.

In some examples the apparatus 103 can comprise a plurality of portions of material 103 that are arranged in in array. The array can comprise a periodic spacing to enable an acoustic interference pattern to be created through constructive and/or destructive interference of pressure waves created by the vibrations of the portions of material 103. The array of portions of material 103 can be configured so that the acoustic interference pattern can focus the pressure waves in a predetermined position. The predetermined position could correspond to the position of a component 113 within the electronic device 107 or any other suitable heat source. This can enable air flow, or other working fluid, to be focused on the component 113 or other heat source.

The one or more portions of material 103 could comprise a magnetostrictive material such as cobalt, Terfenol D, galfenol or any other suitable material or combinations of material. In some examples the portions of material 103 could comprise a magnetocaloric material such as gadolinium or any other suitable material or combinations of material.

The apparatus 101 can be provided in any suitable location within the electronic device 107. The apparatus 101 can be positioned within the electronic device 107 so that vibration of the one or more portions of material 103 can provide cooling for the cooling system 115. In some examples the apparatus 101 can be positioned within the apparatus 107 so that one or more portions of material 103 can be positioned adjacent to or in close proximity to the components 113. In some examples the apparatus 101 can be positioned so that the vibrations of the one or more portions of material 103 directs a flow of a working fluid of the cooling system 115 towards the components 113.

In the example shown in FIG. 1 the electronic device 107 comprises a single cooling apparatus 101. It is to be appreciated that in some examples of the disclosure the electronic device 107 could comprise a plurality of cooling apparatus 101. The different cooling apparatus 101 could be provided in different positions within the electronic device 107 to enable cooling of the different components within the electronic device 107. In other examples the cooling apparatus 101 could comprise a plurality of different portions of material 103 or a plurality of different arrays of different portions of material 103 that could be configured to enable cooling of different components of the electronic device 107.

The varying magnetic field 105 is provided by a magnetic field source 111. The magnetic field source 111 can comprise any means that can provide a varying magnetic field 105 with ultrasonic frequencies. In the example of FIG. 1 the magnetic field source 111 comprises one or more charging coils 109 coils that can be configured to enable inductive charging of the electronic device 107. Other types of magnetic field source can be used in other examples of the disclosure.

In the example shown in FIG. 1 the charging coils 109 that provide the varying magnetic field 105 for the one or more portions of material 103 are provided externally to the electronic device 107. In such examples the charging coils 109 could be provided in a separate charging device or any other suitable type of auxiliary or peripheral device.

In other examples magnetic field source 111 could be provided internally to the electronic device 107. For instance, the charging coils within the electronic device 107 could be used to enable charge transfer into the electronic device 107 and also to cause the vibration of the one or more portions of material 103.

In some examples the magnetic field source 111 can be configured to be controlled by a controller or other control means. In such examples the magnetic field source 111 can be controlled to control the cooling provided by the cooling apparatus 101. For instance, the frequency of the varying magnetic field 105 can be selected to control the vibrations of the one or more portions of material 103 and so control the cooling provided by the cooling apparatus 101.

The magnetic field source 111 is positioned relative to the electronic device 107 so that when the apparatus 101 is in use the one or more portions of material 103 are positioned within the varying magnetic field 105 provided by the magnetic field source 111.

When the apparatus 101 is in use the magnetic field source 111 is controlled to provide a varying magnetic field 105. The apparatus 101 is positioned so that the one or more portions or material 103 are positioned within the varying magnetic field 105.

The varying magnetic field 105 causes vibrations of the one or more portions of material 103 through the magnetostrictive effect or through the magnetocaloric effect depending upon the type of material that has been used. The frequency of the vibrations of the portions of material 103 will correspond to the frequency of the varying magnetic field 105. The frequency of the vibrations of the portions of material 103 can be an ultrasonic frequency. The portions of material 103 can have a plurality of different resonant modes that can enable them to vibrate at different ultrasonic frequencies.

The vibration of the one or more portions of material 103 can provide cooling of the components 113 by providing increased cooling within the cooling system 115.

In some examples the increased cooling can be provided by providing an increased flow of working fluid within the cooling system 115. For instance, where air cooling is used to cool the components 113 the vibrations of the one or more portions of material 103 can increase the flow of air. In such examples the one or more portions of material 103 or arrays of portions of material 103 can be shaped so as to direct flow of the air in a given direction. For instance, the portions of material 103 could be shaped as fins to direct cool air towards one or more hot components 113 or to direct the warmed air away from the hot components 113. In some examples, where air cooling is used, air from the surrounding environment of the electronic device 107 can be used in the cooling system 115. For example, cool air can enter through one or more vents of the electronic device. Similarly, in some examples, heated air can be directed out of the electronic device 107 through one or more vents.

In some examples the portions of material 103 could be configured in an array so that the vibrations of the portions of material 103 can create an acoustic interference pattern that focusses flow of the working fluid towards the hot components 113. This can enable a cooling jet of air or other fluid to be directed towards the hot components 113 or other heat sources.

In some examples the cooling system 115 could be a liquid or two-phase cooling system. In such examples the vibrations of the one or more portions of material 103 could be used to increase the flow of the liquid or two-phase fluid through the cooling system. This could increase the flow of cool fluid towards the hot components 113 and/or increase the flow of heated fluid away from the hot components 113.

In some examples the working fluid of the cooling system 115 can be incident on the one or more portions of material 103 and the vibration of the one or more portions of material 103 can direct the working fluid through the cooling system. For instance, the surface of the one or more portions of material 103 can be shaped so as to direct the flow of droplets of a liquid. In such examples, the surface of the one or more portions of material 103 could have a saw-tooth profile so that when the one or more portions of material 103 vibrates the liquid droplets are directed in the direction of the sloped edge of the saw teeth. This could be used to direct a fluid in a liquid phase towards an evaporator region of a cooling system 115.

In some examples the apparatus 101 can comprise a plurality of different arrays of portions of material 103. An array can comprise a plurality of portions of material 103. The different arrays can be configured to provide resonant modes at different frequencies so that the apparatus 101 can provide cooling when varying magnetic fields 105 with different frequencies are used. In some examples the magnetic field source 111 can be configured to control which of the available arrays of portions of material 103 are used by controlling the frequency of the varying magnetic field 105 provided by the magnetic field source 111.

In some examples the different arrays of portions of material 103 can comprise different portions of materials 103 that have different sizes and shapes so that they are configured to resonate at different frequencies. In some examples the arrays can comprise different portions of material 103 that have a different periodic spacings so that an acoustic interference pattern can be generated at different frequencies. In some examples a single portion 103 of material can be part of more than one array. For instance a single portion of material 103 can be positioned with a first periodic spacing from a first portion of material 103 so as to provide an interference pattern at a first frequency. The same single portion of material 103 can be positioned with a second periodic spacing from a second portion of material 103 so as to provide an interference pattern at a second frequency.

In some examples the apparatus 101 can be configured so that the vibration of the one or more portions of material 103 causes an increase of evaporation of a working fluid within a cooling system. For example, the one or more portions of material 103 can be configured so that droplets of the working fluid can form on the surface of the one or more portions 103 of the material. The vibrations of the one or more portions of material 103 can cause the droplets to coalesce and increase the evaporation of the fluid thereby increasing heat transfer.

In some examples the apparatus 101 can be configured to enable the level of cooling provided by the apparatus 101 to be controlled. For instance, in some examples the means for providing the varying magnetic field 105 can be configured to provide the varying magnetic fields at different frequencies. The different frequencies can cause different frequencies of vibrations of the one or more portions of material 103 which can cause different levels of cooling to be provided. In some examples this can cause different arrays of portions of material 103 to be activated. The different arrays of portions of material 103 can be located in different positions and can enable cooling of different components 113 or other heat sources.

In the example shown in FIG. 1 the one or more portions of material 103 are provided within the electronic device 107 that is to be cooled. In other examples the portions of material 103 could be provided in a different device but could be configured to be positioned close to an electronic device 107 during use. For instance, the portions of material 103 could be provided in an inductive charging device and could be configured to provide cooling for the electronic device 107 when the electronic device 107 is being charged by the charging device. In such examples the one or more portions of material 103 could be configured to generate an air flow towards the electronic device 107 that enables cooling of the electronic device 107.

In some examples the positions and arrangements of the one or more portions of material 103 can be designed using an algorithm so as to provide a desired cooling effect for one or more available frequencies of the magnetic field 105.

FIG. 2 shows another example apparatus 101 according to examples of the disclosure. In this example the apparatus 101 is provided in an electronic device 107. In the example shown in FIG. 2 the electronic device 107 is being inductively charged by a charging device 201.

The apparatus 101 can comprise an array of portions of material 103 that are configured to vibrate at one or more ultrasonic frequencies when the material is positioned within a varying magnetic field 105.

The portions of material 103 are positioned within the electronic device 107 so that when the electronic device 107 is being inductively charged the varying magnetic field from the charging device 201 is incident on the portions of material 103. The portions of material 103 can be provided on the surface of the electronic device 107 or embedded within components of the electronic device 107 or in any other suitable configuration.

The electronic device 107 also comprises one or more components 113 that require cooling. The components can comprise processing units, display units, power sources or any other type of components. The one or more portions of material 103 are positioned within the electronic device 107 so that the vibration of the portions of material 103 can provide cooling for the one or more components 113.

In the example shown in FIG. 2 the electronic device is being inductively charged by a charging device 201. The charging device 201 comprises one or more inductive charging coils 109. The inductive charging coils 109 create a varying magnetic field 105 that can transfer power to the electronic device 107. In examples of the disclosure the varying magnetic field 105 provided by the inductive charging coils 109 also causes the vibration of the portions of material 103 that can provide increased cooling as described above.

The electronic device 107 could be used while it is docked in or otherwise positioned adjacent to, the charging device 201. For instance, a user could be viewing data on the display of the electronic device 107 or could be using the electronic device 107 to render content or for communications functions or for any other suitable purpose. The use of the electronic device 107 can cause one or more components 113 within the electronic device 107 to generate unwanted heat. In such examples the cooling effect provided by the one or more portions of material 103 can be used to cool the components of the electronic device 107.

A single charging coil 109 in the charging device 201 is shown in FIG. 2. It is to be appreciated that in other examples of the disclosure the charging device 201 can comprise a plurality of charging coils 109. The plurality of charging coils 109 can be distributed within the charging device 201 so that when an electronic device 107 is positioned adjacent to the charging device 201 for charging only a subset of the plurality of charging coils 109 are aligned within the corresponding charging coils of the electronic device 107 and used to provide inductive charging of the electronic device 107. The subset of the plurality of charging coils 109 that are used for inductive charging can be selected based on the relative position of the charging coils 109 in the charging device 201 and the corresponding coils in the electronic device 107. The subset of charging coils 109 that are used for charging can be selected to provide the most efficient charge transfer. In such examples a second subset of charging coils 109 that are not being used for inductive charging can be used to provide the varying magnetic field 105 for the one or more portions of material 103.

In some examples the apparatus 101 can allow for faster charging of the electronic device 107 by enabling heat generated by the charging coils 109 to be transferred away from the electronic device 107 and/or the charging device 201. This can increase the power that can be used for the inductive charging. In such examples the one or more portions of material 103 can be positioned between the electronic device 107 and the charging device 201 so as to provide for improved air flow in the gap between the electronic device 107 and the charging device 201 during charging.

FIG. 2 shows an example apparatus 101 being used in an electronic device 107 however it is to be appreciated that the apparatus 101 could be used in any type of device that needs cooling such as within a chemical or refrigeration process. The cooling apparatus 101 can be in a fixed position within the device that is to be cooled or can be external to the device that it to be cooled. In some examples the apparatus 101 can be moveable relative to the device that is to be cooled so that the apparatus 101 can be positioned closer to the hotter regions of the device.

Also, the magnetic field source 111 need not be a charging coil 109 but could be a source that provides a varying magnetic field 105 that could be used for any other purpose. In some examples the magnetic field source 111 could be provided solely, or primarily, for causing the vibrations of the portions of material 103.

FIG. 3 shows another example cooling apparatus 101 according to examples of the disclosure. The example cooling apparatus 101 comprises a vapor chamber 301. The vapor chamber 301 comprise one or more portions of material 103 that are configured to vibrate at one or more ultrasonic frequencies when the material is positioned within a varying magnetic field 105.

In the example shown in FIG. 3 the one or more portions of material 103 are provided on the surface of the vapour chamber 301. In other examples the one or more portions of material 103 could be incorporated within the materials of the vapour chamber 301.

The one or more portions of material 103 in any location of the vapour chamber 301 are configured such that vibration of the one or more portions of material 103 improves the heat transfer by the vapour chamber 301. In some examples the one or more portions of material 103 can be provided at the evaporator region of the vapour chamber 301 so as to facilitate evaporation of a working fluid within the vapour chamber 301. In other examples the one or more portions of material 103 could be provided within the vapour chamber 301 so as to enable the working fluid to flow towards the evaporator region.

In the example shown in FIG. 3 the evaporator region of the vapour chamber 301 is provided in proximity to a heat source. The evaporator region of the vapor chamber 301 is provided in proximity to the heat source so that heat from the heat source can be transferred to a working fluid within the evaporator region of the vapor chamber. The heat source could be an electronic component 113 such as a processor or a screen that generates unwanted heat during use or any other suitable source of heat.

A condenser region is provided at a different section of the vapor chamber 301. For example, the condenser region could be provided on the opposite side of the vapour chamber 301 to the evaporator region so that the condenser region has a cooler temperature than the evaporator region.

When the vapour chamber 301 is in use heat from the heat source causes a working fluid within the vapor chamber 301 to evaporate at the evaporator region and change phase from a liquid to a gas. The working fluid in the gas phase travels from the evaporator region through the internal volume of the vapor chamber 301 to the condenser region. At the condenser region the comparatively cooler temperature causes the working fluid to condense and change phase from a gas to a liquid. As a result, heat is transferred from the evaporator region to the condenser region.

Examples of the disclosure can increase the heat transferred by the vapour chamber 301 through the vibrations of the one or more portions of material 103. In the example shown in FIG. 3 a varying magnetic field can be provided by one or more charging coils 109 from a charging device 201. It is to be appreciated that other sources for a varying magnetic field can be used in other examples of the disclosure.

In the example shown in FIG. 3 the portion of material 103 has a spiral shape that corresponds to the shape of the charging coil 109 in the charging device 201. Other shapes and configurations of the one or more portions of material 103 could be used in other examples of the disclosure.

In the example shown in FIG. 3 the one or more portions of material 103 are provided within a vapour chamber 301. The portions of material 103 could be provided within other types of cooling systems in other examples of the disclosure. For instance, the one or more portions of material 103 could be provided within a heat pipe or any other suitable type of cooling device. In some examples the one or more portions of material could be provided within channels and/or ducts of cooling systems so as to enable the transfer of working fluid though the channels and/or ducts.

The vapour chamber 301 can comprise a module that can be provided within an electronic device 107 such as a mobile phone or other suitable type of electronic device 107. The vapour chamber 301 can be sized and shaped so as to fit in any suitable location of the electronic device 107. The portions of material 103 within the vapour chamber 301 can be positioned so as to provide cooling for the components of the electronic device 107.

FIG. 4 shows an example method that can be implemented using apparatus 101 as described above. In this example the apparatus 101 can comprise a plurality of different arrays of portions of material 103 configured to vibrate at one or more ultrasonic frequencies when the material is positioned within a varying magnetic field 105. The different arrays can be configured to operate at different frequencies of the varying magnetic field 105.

At block 401 the apparatus 101 is positioned within a varying electromagnetic field 105. In some examples this can be achieved by positioning an electronic device 107 adjacent to a charging device 201 so as to enable inductive charging of the electronic device 107. In other examples the source of the varying magnetic field 105 could be provided within the same device as the one or more portions of material 103. In such examples the apparatus 101 can be positioned within a varying electromagnetic field 105 by activating the one or more sources 111 of the varying magnetic field 105.

At block 403 the method comprises selecting one or more portions of material 103 where the selection is based on heat transfer requirements of a cooling system 115. In some examples the selecting can comprise determining which of a plurality of arrays of portions of material 103 can provide a desired cooling effect.

In some examples the one or more portions of material 103 can be selected based on the components 113 within the electronic device 107 that require additional cooling. In such examples the array or arrays that are positioned closest to these components 113 can be selected.

In some examples the one or more portions of material 103 can be selected based on the amount of excess heat that needs to be removed. For example, activating different arrays of portions of material 103 can provide for different levels of heat transfer. In such examples the amount of heat transfer required can be determined and then the appropriate array of portions of material 103 can be selected on that basis.

At block 405 the source of the varying magnetic field 111 is controlled to enable a varying magnetic field 105 to be provided having a frequency corresponding to the resonant frequency of the selected one or more portions of material 103. The frequency of the varying magnetic field 105 therefore depends on the one or more portions of material 103 that have been selected at block 403.

At block 407 the varying magnetic field 105 causes the vibration of the one or more portions of the material 103. The one or more portions of material 103 vibrate with the same frequency as the varying magnetic field 105. In examples of the disclosure the frequency can be an ultrasonic frequency.

At block 409 the vibration of the one or more portions of material provides improved cooling within the cooling system 115.

In the example shown in FIG. 4 the method also comprises an optional block 411 of updating the selected one or more portions of material 103. This enables the selected one or more portions of material 103 to be updated if needed. For example, if the amount of heat that is being generated increases or decreases then the one or more portions of material 103 that are being used can be changed to take the change in required heat transfer into account. In some examples the one or more portions of material 103 that are selected could be changed if there is determined to be a change in the components 113 of the electronic device 107 that are being used. For instance, if a different component 113 is determined to be generating more heat then the array closest to this component 113 could be selected. In other examples, if a component 113 that is very temperature sensitive is being used then the amount of cooling provided could be increased so as to ensure that this component is kept cool.

Once the new one or more portions of material 103 has been selected the method returns to block 405 and the source 111 of the varying magnetic field 105 is controlled to provide the varying magnetic field 105 at the resonant frequency of the newly selected array.

It is to be appreciated that variations of the method can be made in examples of the disclosure. For instance, in the example of FIG. 4 the frequency of the varying magnetic field 105 is controlled to match the resonant frequency of the selected array of portions of material 103. In other examples the frequency of the magnetic field can be fixed by the charging protocol being used or by any other suitable factor. In such examples the available frequency of the varying magnetic field 105 can be taken into account at block 403 when the one or more portions of material 103 are being selected.

FIG. 5 schematically illustrates a controller 501 according to examples of the disclosure. The controller 501 illustrated in FIG. 5 can be a chip or a chip-set. In some examples the controller 501 can be provided within electronic devices 107 such as mobile phones, or charging devices 201 or any other suitable type of device.

The implementation of the controller 501 can be as controller circuitry. In some examples the controller 501 can be implemented in hardware alone, have certain aspects in software including firmware alone or can be a combination of hardware and software (including firmware).

As illustrated in FIG. 5 the controller 501 can be implemented using instructions that enable hardware functionality, for example, by using executable instructions of a computer program 509 in a general-purpose or special-purpose processor 505 that can be stored on a computer readable storage medium (disk, memory etc.) to be executed by such a processor 505.

The processor 505 is configured to read from and write to the memory 507. The processor 505 can also comprise an output interface via which data and/or commands are output by the processor 505 and an input interface via which data and/or commands are input to the processor 505.

The memory 507 is configured to store a computer program 509 comprising computer program instructions (computer program code 503) that controls the operation of the controller 501 when loaded into the processor 505. The computer program instructions, of the computer program 09, provide the logic and routines that enables the controller 501 to perform the methods illustrated in FIG. 4. The processor 505 by reading the memory 507 is able to load and execute the computer program 509.

The controller 501 therefore comprises: at least one processor 505; and at least one memory 507 including computer program code 503, the at least one memory 507 and the computer program code 503 configured to, with the at least one processor 505, cause the controller 501 at least to perform: selecting 403 one or more portions of material 103 configured to vibrate at one or more ultrasonic frequencies when the material is positioned within a varying magnetic field 105, the selection based on heat transfer requirements of a cooling system; controlling one or more sources of a varying magnetic field 105 to provide a varying magnetic field at a frequency corresponding to the selected one or more portions of material 103 configured to vibrate at one or more ultrasonic frequencies.

As illustrated in FIG. 5 the computer program 509 can arrive at the controller 501 via any suitable delivery mechanism 511. The delivery mechanism 511 can be, for example, a machine readable medium, a computer-readable medium, a non-transitory computer-readable storage medium, a computer program product, a memory device, a record medium such as a Compact Disc Read-Only Memory (CD-ROM) or a Digital Versatile Disc (DVD) or a solid state memory, an article of manufacture that comprises or tangibly embodies the computer program 509. The delivery mechanism can be a signal configured to reliably transfer the computer program 509. The controller 501 can propagate or transmit the computer program 509 as a computer data signal. In some examples the computer program 509 can be transmitted to the controller 501 using a wireless protocol such as Bluetooth, Bluetooth Low Energy, Bluetooth Smart, 6LoWPan (IP$_v$6 over low power personal area networks) ZigBee, ANT+, near field communication (NFC), Radio frequency identification, wireless local area network (wireless LAN) or any other suitable protocol.

The computer program 509 comprises computer program instructions for causing an controller 501 to perform at least the following: selecting 403 one or more portions of material 103 configured to vibrate at one or more ultrasonic frequencies when the material is positioned within a varying magnetic field 105, the selection based on heat transfer requirements of a cooling system; controlling one or more sources of a varying magnetic field 105 to provide a varying magnetic field at a frequency corresponding to the selected one or more portions of material 103 configured to vibrate at one or more ultrasonic frequencies.

The computer program instructions can be comprised in a computer program 509, a non-transitory computer readable medium, a computer program product, a machine readable medium. In some but not necessarily all examples, the computer program instructions can be distributed over more than one computer program 509.

Although the memory 507 is illustrated as a single component/circuitry it can be implemented as one or more separate components/circuitry some or all of which can be integrated/removable and/or can provide permanent/semipermanent/dynamic/cached storage.

Although the processor 505 is illustrated as a single component/circuitry it can be implemented as one or more separate components/circuitry some or all of which can be integrated/removable. The processor 505 can be a single core or multi-core processor.

References to "computer-readable storage medium", "computer program product", "tangibly embodied computer program" etc. or a "controller", "computer", "processor" etc. should be understood to encompass not only computers having different architectures such as single/multi-processor architectures and sequential (Von Neumann)/parallel architectures but also specialized circuits such as field-programmable gate arrays (FPGA), application specific circuits (ASIC), signal processing devices and other processing circuitry. References to computer program, instructions, code etc. should be understood to encompass software for a programmable processor or firmware such as, for example, the programmable content of a hardware device whether instructions for a processor, or configuration settings for a fixed-function device, gate array or programmable logic device etc.

As used in this application, the term "circuitry" can refer to one or more or all of the following:
(a) hardware-only circuitry implementations (such as implementations in only analog and/or digital circuitry) and
(b) combinations of hardware circuits and software, such as (as applicable):
(i) a combination of analog and/or digital hardware circuit(s) with software/firmware and
(ii) any portions of hardware processor(s) with software (including digital signal processor(s)), software, and memory(ies) that work together to cause an apparatus, such as a mobile phone or server, to perform various functions and
(c) hardware circuit(s) and or processor(s), such as a microprocessor(s) or a portion of a microprocessor(s), that requires software (e.g. firmware) for operation, but the software can not be present when it is not needed for operation.

This definition of circuitry applies to all uses of this term in this application, including in any claims. As a further example, as used in this application, the term circuitry also covers an implementation of merely a hardware circuit or processor and its (or their) accompanying software and/or firmware. The term circuitry also covers, for example and if applicable to the particular claim element, a baseband integrated circuit for a mobile device or a similar integrated circuit in a server, a cellular network device, or other computing or network device.

The blocks illustrated in FIG. 4 can represent steps in a method and/or sections of code in the computer program 509. The illustration of a particular order to the blocks does not necessarily imply that there is a required or preferred order for the blocks and the order and arrangement of the blocks can be varied. Furthermore, it can be possible for some blocks to be omitted.

Examples of the disclosure therefore provide an apparatus 101 that enables improved cooling of electronic devices 107. In some examples of the disclosure, the apparatus 101 can make use of existing varying magnetic fields 105, that are being used for charging or any other purpose, and so provides for an energy efficient cooling system.

In the examples described above the apparatus 101 is configured to enable cooling of electronic devices such as mobile telephones. It is to be appreciated that the apparatus 101 could be configured to provide for cooling of other electronic devices such as electric vehicles or any other suitable electronic devices.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although examples have been described in the preceding paragraphs with reference to various examples, it should be appreciated that modifications to the examples given can be made without departing from the scope of the claims.

Features described in the preceding description may be used in combinations other than the combinations explicitly described above.

Although functions have been described with reference to certain features, those functions may be performable by other features whether described or not.

Although features have been described with reference to certain examples, those features may also be present in other examples whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer any exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

We claim:

1. An apparatus comprising:
    one or more portions of material configured to vibrate at one or more ultrasonic frequencies when the material is positioned within a varying magnetic field, the one or more portions of material having shapes that correspond to a frequency of the varying magnetic field applied to the apparatus from an external source;
    wherein a resonant mode of the one or more portions of material corresponds to the one or more ultrasonic frequencies; and
    wherein the one or more portions of material configured to vibrate at the one or more frequencies are positioned so that, when the varying magnetic field is applied to the apparatus, the vibration caused by the varying magnetic field provides increased cooling within a cooling system.

2. An apparatus as claimed in claim 1 further comprising one or more charging coils for providing the varying magnetic field having ultrasonic frequencies.

3. An apparatus as claimed in claim 2 wherein the one or more charging coils are configured to enable inductive charging of an electronic device.

4. An apparatus as claimed in claim 1 further comprising a plurality of charging coils for providing the varying magnetic field, wherein the plurality of charging coils are configured so that a first subset of the charging coils are used for wireless charging of an electronic device while a second subset of the charging coils are used for providing the varying magnetic field.

5. An apparatus as claimed in claim 4 wherein which of the plurality of charging coils are provided in the first subset and the second subset is dependent upon the position of the electronic device relative to the plurality of charging coils.

6. An apparatus as claimed in claim 1 wherein the apparatus is further configured so that the vibration of the one or more portions of material configured to vibrate at one or more ultrasonic frequencies causes an increase flow of working fluid within the cooling system.

7. An apparatus as claimed in claim 6 wherein the one or more portions of material configured to vibrate at one or more ultrasonic frequencies are shaped so as to direct the flow of the working fluid in a given direction.

8. An apparatus as claimed in claim 1 wherein the apparatus is further configured so that the vibration of the one or more portions of material configured to vibrate at one or more ultrasonic frequencies causes an increase of evaporation of a working fluid within the cooling system.

9. An apparatus as claimed in claim 1 wherein the apparatus further comprises a plurality of the portions of material configured to vibrate at one or more ultrasonic frequencies and the plurality of portions of the material configured to vibrate at one or more ultrasonic frequencies are provided in a periodic array to control the flow of working fluid through acoustic interference patterns generated by vibration of at least some of the plurality of portions of material configured to vibrate at one or more ultrasonic frequencies.

10. An apparatus as claimed in claim 1 further comprising a plurality of different arrays of portions of the material configured to vibrate at one or more ultrasonic frequencies where the different arrays are configured to vibrate at different frequencies.

11. An apparatus as claimed in claim 10 wherein a respective one or more of the different arrays comprises a periodic spacing of the portions of material to enable an acoustic the destructive interference of pressure waves created by vibrations of the portions of material of the respective array.

12. An apparatus as claimed in claim 1 further comprising at least one processor and at least one memory including computer program code;
    the at least one memory and the computer program code configured to, with the at least one processor, cause the apparatus to: control the frequency of the varying magnetic field so as to control the level of cooling within the cooling system.

13. An apparatus as claimed in claim 1 wherein the apparatus configured to control the location at which cooling is provided by at least one of; the arrangement of the one or more portions of material configured to vibrate, or a frequency of the magnetic field.

14. An apparatus as claimed in claim 1 wherein the one or more portions of material configured to vibrate comprise at least one of: magnetostrictive material, or magnetocaloric material.

\* \* \* \* \*